(12) United States Patent
Sakairi

(10) Patent No.: US 10,541,275 B2
(45) Date of Patent: Jan. 21, 2020

(54) DISPLAY DEVICE AND ELECTRONIC APPARATUS

(71) Applicant: Sony Corporation, Tokyo (JP)

(72) Inventor: Takashi Sakairi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/542,754

(22) PCT Filed: Oct. 26, 2015

(86) PCT No.: PCT/JP2015/080054
§ 371 (c)(1),
(2) Date: Jul. 11, 2017

(87) PCT Pub. No.: WO2016/125347
PCT Pub. Date: Aug. 11, 2016

(65) Prior Publication Data
US 2018/0006095 A1 Jan. 4, 2018

(30) Foreign Application Priority Data
Feb. 3, 2015 (JP) .................................. 2015-019391

(51) Int. Cl.
*H01L 27/32* (2006.01)
*H01L 51/50* (2006.01)
*H01L 51/52* (2006.01)

(52) U.S. Cl.
CPC ........ *H01L 27/3206* (2013.01); *H01L 51/504* (2013.01); *H01L 51/5218* (2013.01); *H01L 51/5234* (2013.01); *H01L 51/5253* (2013.01); *H01L 51/5265* (2013.01)

(58) Field of Classification Search
CPC ............. H01L 51/5036; H01L 51/5265; H01L 2251/558; H01L 51/5234; H01L 51/5221; H01L 27/3216; H01L 33/465; H01L 27/3211–3218; H01L 51/5218
See application file for complete search history.

(56) References Cited

U.S. PATENT DOCUMENTS

2007/0188084 A1* 8/2007 Fukuoka ............. H01L 51/5265
313/506
2009/0278450 A1* 11/2009 Sonoyama ............ H01L 27/322
313/504
(Continued)

FOREIGN PATENT DOCUMENTS

JP   2003-508876 A   3/2003
JP   2007-280677 A   10/2007
(Continued)

*Primary Examiner* — Frederick B Hargrove
(74) *Attorney, Agent, or Firm* — Michael Best & Friedrich LLP

(57) ABSTRACT

A display device according to the present disclosure has a resonator structure in which a light reflector and a semi-transmissive plate are disposed at a distance that differs for each luminescent color. In this resonator structure, a light-emitting function layer including a light-emitting layer, a transparent cathode electrode, and a protective film that protects the cathode electrode are laminated in order between the light reflector and the semi-transmissive plate. In addition, the semi-transmissive plate is formed on the protective film.

10 Claims, 8 Drawing Sheets

(56) References Cited

U.S. PATENT DOCUMENTS

| | | | | |
|---|---|---|---|---|
| 2010/0320446 A1* | 12/2010 | Kang | ................ | H01L 51/5265 |
| | | | | 257/40 |
| 2014/0295597 A1* | 10/2014 | Sato | ................ | H01L 51/5262 |
| | | | | 438/29 |
| 2015/0001558 A1* | 1/2015 | Nozawa | ................ | H01L 51/5265 |
| | | | | 257/88 |
| 2015/0179945 A1* | 6/2015 | Chien | ................ | H01L 51/0013 |
| | | | | 438/35 |

FOREIGN PATENT DOCUMENTS

| | | | |
|---|---|---|---|
| JP | 2009-135081 | A | 6/2009 |
| JP | 2010-211985 | A | 9/2010 |
| JP | 2011-159431 | A | 8/2011 |
| JP | 2011-159433 | A | 8/2011 |
| JP | 2012-248433 | A | 12/2012 |
| JP | 2012-248517 | A | 12/2012 |
| WO | 2005/086541 | A1 | 9/2005 |

\* cited by examiner

DISPLAY DEVICE AND ELECTRONIC APPARATUS

TECHNICAL FIELD

The present disclosure relates to a display device and an electronic apparatus.

BACKGROUND ART

There are organic electroluminescence (EL) display devices using an organic EL element that is a self-light emitting element, as a light-emitting element of a pixel. In such an organic EL display device, a resonator structure that emphasizes light having a specific wavelength by a resonance effect is employed, making it possible to expand a color gamut and improve luminance efficiency (for example, refer to Patent Document 1).

In the display device described in Patent Document 1, an anode electrode is a semi-transmissive electrode, and an interlayer film is provided between the anode electrode and a light reflector. The film thickness of the interlayer film is changed to thereby change an optical path length between the anode electrode that is the semi-transmissive electrode and the light reflector. Then, a luminescent color is changed for each pixel by a resonance effect between the semi-transmissive electrode (anode electrode) and the light reflector.

CITATION LIST

Patent Document

Patent Document 1: Japanese Patent Application Laid-open No. 2009-135081

SUMMARY OF THE INVENTION

Problems to be Solved by the Invention

To maximally utilize the resonance effect in the above-described display device employing the resonator structure, it is necessary to suppress a variation in a final optical path length of the resonator structure. However, in the display device described in Patent Document 1, the optical path length between the semi-transmissive electrode and the light reflector is changed by changing the film thickness of the interlayer film interposed between the anode electrode and the light reflector. Therefore, the final optical path length is determined only by the film formation of a light-emitting function layer that cannot be processed. This makes it difficult to adjust the final optical path length even if there is a variation in the final optical path length. As a result, it is impossible to maximally utilize the resonance effect, thus producing a variation in a color gamut and luminance efficiency.

Accordingly, it is an object of the present disclosure to provide a display device that allows maximally utilizing a resonance effect and further enhancing the resonance effect and to provide an electronic apparatus including the display device.

Solutions to Problems

In a display device according to the present disclosure to achieve the above object, a light reflector and a semi-transmissive plate are disposed at a distance that differs for each luminescent color. A light-emitting function layer including a light-emitting layer, a transparent cathode electrode, and a protective film that protects the cathode electrode are laminated in order between the light reflector and the semi-transmissive plate. The semi-transmissive plate is formed on the protective film. Furthermore, an electronic apparatus according to the present disclosure to achieve the above object includes the display device configured as above.

The display device configured as above or the electronic apparatus including the display device has a structure in which the cathode electrode is disposed on the light-emitting function layer, the semi-transmissive plate is disposed on the cathode electrode through the protective film, and a resonance effect is obtained between the light reflector and the semi-transmissive plate, the distance between which differs for each luminescent color. According to this structure, the semi-transmissive plate is formed after the protective film is formed, and a final optical path length between the light reflector and the semi-transmissive plate can be determined by processing the protective film. Therefore, a variation in the final optical path length of the resonator structure can be suppressed.

Effects of the Invention

According to the present disclosure, it is possible to suppress a variation in the final optical path length of the resonator structure. As a result, it is possible to maximally utilize the resonance effect and to further enhance the resonance effect. Note that effects are not necessarily limited to those described herein, and the effects may be any effects described in the specification. Furthermore, the effects described in the specification are merely exemplary. The effects are not limited to those effects and there may be additional effects.

BRIEF DESCRIPTION OF DRAWINGS

FIG. 7 is an external view illustrating a lens-interchangeable single-lens reflex type digital still camera.

MODE FOR CARRYING OUT THE INVENTION

Figure 1:
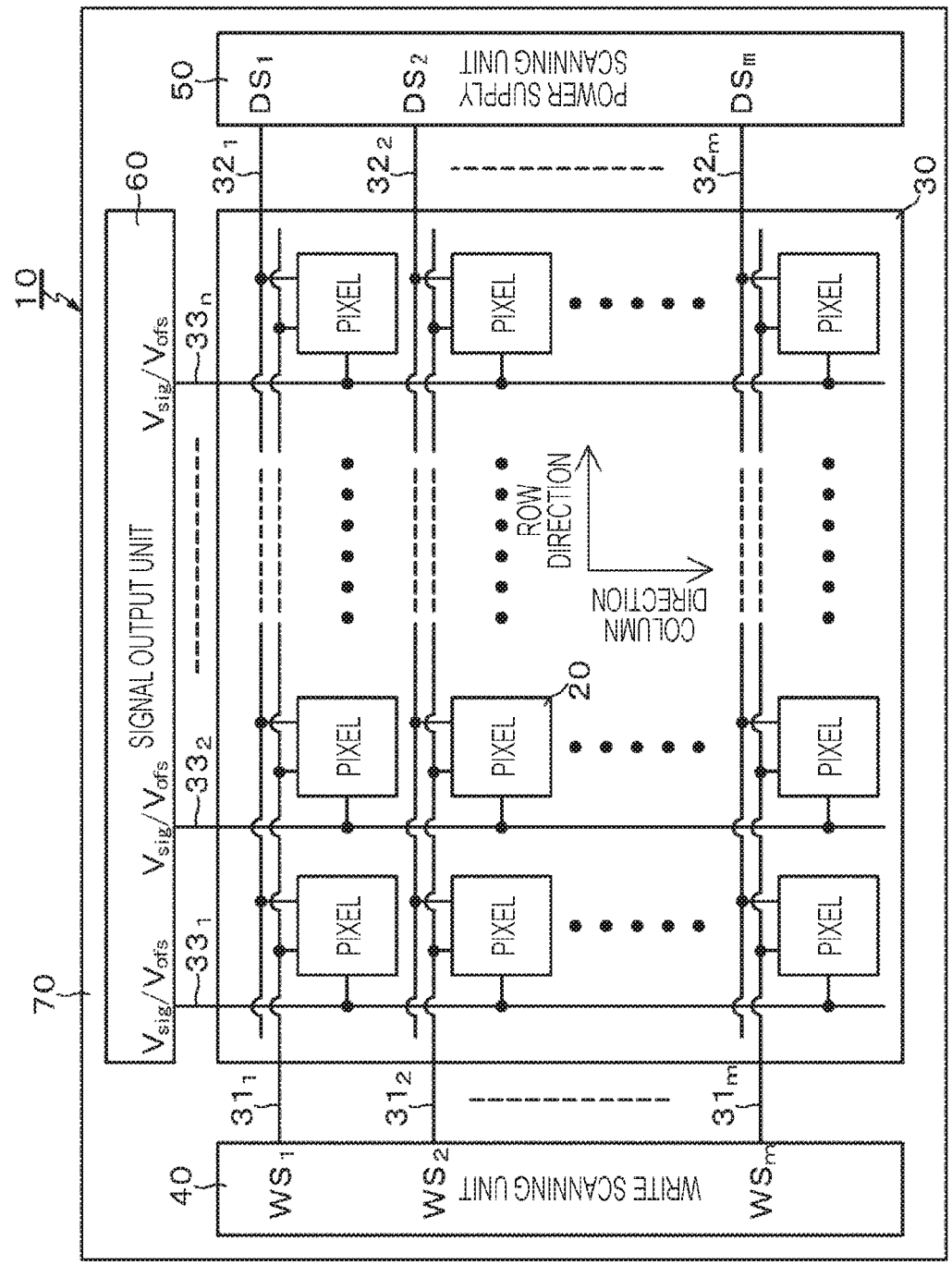
FIG. 1 is a system configuration diagram schematically illustrating a basic configuration of an active-matrix organic EL display device that is a prerequisite of the present disclosure.

Hereinafter, modes for carrying out technology according to the present disclosure (hereinafter described as "embodiments") will be described with reference to the drawings.

The technology according to the present disclosure is not limited to the embodiments, and various numerical values, materials and the like in the embodiments are exemplary. In the following description, the same components or components having the same function will be denoted with the same reference signs and duplicate description thereof will be omitted. Note that the description will be made in the following order, 1. General description on display device and electronic apparatus according to present disclosure
2. Display device that is prerequisite of present disclosure
   2-1. System configuration
   2-2. Pixel circuit
   2-3. Resonator structure
3. One embodiment of present disclosure
   3-1. First embodiment
   3-2. Second embodiment
4. Electronic apparatus <General Description on Display Device and Electronic Apparatus According to Present Disclosure>

A display device and an electronic apparatus including the display device according to the present disclosure include a resonator structure in which a resonance effect is obtained between a semi-transmissive plate and a light reflector, the distance between which differs for each luminescent color. Different color light has different wavelengths. Therefore, in the resonator structure, a spectrum peak wavelength of each color is caused to match an optical path length between the semi-transmissive plate and the light reflector, thus extracting the strongest light from each color. Light generated in a light-emitting function layer repeats reflection between the semi-transmissive plate and the light reflector. Then, only light having a wavelength that matches the optical path length is resonated and emphasized, while other light having a wavelength that mismatches the optical path length is weakened. As a result, a spectrum of light extracted to the outside becomes steep and highly intensive, and luminance and chromatic purity become excellent.

In the display device and the electronic apparatus including the above-described preferred configuration according to the present disclosure, a configuration is possible in which the film thickness of a protective film differs for each luminescent color. With a different film thickness of the protective film for each luminescent color, the optical path length between the semi-transmissive plate and the light reflector that constitute the resonator structure can be optimized for each luminescent color. Furthermore, a configuration is possible in which a transparent anode electrode is provided between the light reflector and the light-emitting function layer. Alternatively, a configuration is possible in which the light reflector functions as the anode electrode, that is, it functions both as the light reflector and the anode electrode.

Alternatively, in the display device and the electronic apparatus including the above-described preferred configuration according to the present disclosure, a configuration is possible in which an interlayer film is provided between the light reflector and the light-emitting function layer and the film thickness of the interlayer film differs for each luminescent color. With a different film thickness of the interlayer film for each luminescent color, the optical path length between the semi-transmissive plate and the light reflector that constitute the resonator structure can be optimized for each luminescent color. Furthermore, a configuration is possible in which a transparent anode electrode is provided between the interlayer film and the light-emitting function layer.

The display device according to the present disclosure is a color display device in which unit pixels including a plurality of subpixels each having a different luminescent color are disposed in a matrix. In the color display device, one pixel includes three subpixels, that is, a red light-emitting subpixel that emits red light, a green light-emitting subpixel that emits green light, and a blue light-emitting subpixel that emits blue light, or four or more subpixels.

In such a color display device, a configuration is possible in which the light-emitting function layer emits white light. Furthermore, a configuration is possible in which the light-emitting function layer is formed by laminating a red light-emitting function layer that emits red light, a green light-emitting function layer that emits green light, and a blue light-emitting function layer that emits blue light.

In the color display device in which the light-emitting function layer emits white light, a configuration is possible in which a color filter is included, and each color light-emitting subpixel includes a combination of a white color light-emitting element and a color filter. Alternatively, a configuration is possible in which red light, green light, and blue light are extracted for each subpixel by the resonator structure without using the color filter.

In the display device and the electronic apparatus including the above-described preferred configuration according to the present disclosure, a configuration is possible in which the display device is an organic electroluminescence (EL) display device with a light-emitting unit (light-emitting element) having a plurality of subpixels that includes an organic EL element. That is, in the organic EL display device, a subpixel includes an organic EL element.

The organic EL display device can be used, for example, as a monitor device that constitutes a personal computer, a digital camera, or a digital still camera. Also, the organic EL display device can be used as a monitor device that is built in a television receiver, a cell-phone handset, a personal digital assistant (PDA), or a game console. Alternatively, the organic EL display device can be applied to an electronic view finder (EVF) and a head mounted display (HMD). Further alternatively, the organic EL display device can be applied to other illuminating devices including a backlight device for a liquid crystal display device or a plane light source device.

In the organic EL element, an organic layer that is a light-emitting function layer includes a light-emitting layer (for example, light-emitting layer made of an organic light-emitting material). Specifically, this organic layer can include, for example, a laminated structure including a hole transport layer, a light-emitting layer, and an electron transport layer, a laminated structure including a hole transport layer and a light-emitting layer that is used also as an electron transport layer, or a laminated structure including a hole injection layer, a hole transport layer, a light-emitting layer, an electron transport layer, and an electron injection layer. Furthermore, in a case where those laminated structures or the like are in tandem units, the organic layer may include a two-tiered tandem structure in which a first tandem unit, a connection layer, and a second tandem unit are laminated, and furthermore may include a three or more-tiered tandem, structure in which three or more tandem units are laminated. In those cases, an organic layer that generally emits white light can be obtained by changing a luminescent color, that is, red, green, and blue, for each tandem unit.

Examples of a method of forming the organic layer include a physical vapor deposition method (PVD method) such as a vacuum evaporation method; a printing method such as a screen printing method and an Inkjet printing method; a laser transfer method, and various application methods. In the laser transfer method, a laminated structure including a laser absorption layer and an organic layer that are formed on a transfer substrate is irradiated with laser light, thereby separating the organic layer on the laser absorption layer and transferring the organic layer. In a case where an organic layer is formed using the vacuum evaporation method, the organic layer can be obtained by using a so-called metal mask, for example, and depositing materials that have passed through openings provided on the metal mask, or the organic layer may be formed on the entire surface without patterning.

<Display Device That is Prerequisite of Present Disclosure>
[System Configuration]

FIG. 1 is a system configuration diagram schematically illustrating a basic configuration of the active-matrix organic EL display device that is a prerequisite of the present disclosure.

The active-matrix display device is a display device in which the light-emitting unit (light-emitting element) is driven by an active element provided in the same pixel as the light-emitting unit, for example, an insulated-gate field-effect transistor. Typically, a thin film transistor (TFT) can be used as the insulated-gate field-effect transistor.

Herein, a description will be made while exemplifying, as an example, a case of the active-matrix organic EL display device in which the light-emitting unit (light-emitting element) of the unit pixel (pixel circuit) includes an organic EL element. The organic EL element is a current drive-type electrooptic element, the light emission luminance of which varies according to a value of a current that flows through the device. Hereinafter, "unit pixel/pixel circuit" is described simply as "pixel" in some cases.

As illustrated in FIG. 1, an active-matrix organic EL display device 10 that is a prerequisite of the present disclosure includes a pixel array unit 30 and a driving unit (peripheral circuit). The pixel array unit 30 is formed by two-dimensionally disposing a plurality of unit pixels 20 in a matrix (two-dimensional matrix). The driving unit is disposed in an area around the pixel array unit 30 and drives the pixels 20. The driving unit includes, for example, a write scanning unit 40, a power supply scanning unit 50, a signal output unit 60 and the like, and drives each of the pixels 20 in the pixel array unit 30.

In the present embodiment, the write scanning unit 40, the power supply scanning unit 50, and the signal output unit 60 are mounted, as peripheral circuits of the pixel array unit 30, on the same substrate as the pixel array unit 30, that is, on a display panel 70. However, a configuration can be employed in which some or all of the write scanning unit 40, the power supply scanning unit 50, and the signal output unit 60 are provided outside the display panel 70. Furthermore, the write scanning unit 40 and the power supply scanning unit 50 are each disposed on one side of the pixel array unit 30. However, a configuration can be employed in which the write scanning unit 40 and the power supply scanning unit 50 are disposed on both sides of the pixel array unit 30 while sandwiching the pixel array unit 30. As a substrate of the display panel 70, a transparent insulating substrate such as a glass substrate can be used or a semiconductor substrate such as a silicon substrate can be used.

In the organic EL display device 10 supporting a color display, one pixel (unit pixel) that is a unit in forming a color image includes subpixels in a plurality of colors. At this time, each of the subpixels corresponds to the pixels 20 in FIG. 1. More specifically, in the display device supporting a color display, one pixel includes, for example, three subpixels, that is, a red (R) light-emitting subpixel, a green (G) light-emitting subpixel, and a blue (B) light-emitting subpixel.

However, the configuration of one pixel is not limited to a combination of subpixels in the three primary colors RGB. One pixel can be configured by further adding a subpixel in one color or subpixels in a plurality of colors to the subpixels in the three primary colors. More specifically, for example, to improve luminance, one pixel can be configured by adding a white (W) light-emitting subpixel. In addition, to expand a color reproduction range, one pixel can be configured by adding at least one complementary color light-emitting subpixel.

In the pixel array unit 30, with respect to an array of the pixels 20 in in rows and n columns, a scanning line 31 ($31_1$ to $31_m$) and a power supply line 32 ($32_1$ to $32_m$) are wired along a row direction (pixel array direction of a pixel row/horizontal direction) for each pixel row. Additionally, with respect to the array of the pixels 20 in in rows and n columns, a signal line 33 ($33_1$ to $33_n$) is wired along a column direction (pixel array direction of a pixel column/vertical direction) for each pixel column.

The scanning lines $31_1$ to $31_m$ are each connected to an output end in a corresponding row of the write scanning unit 40. The power supply lines $32_1$ to $32_m$ are each connected to an output end in a corresponding row of the power supply scanning unit 50. The signal lines $33_1$ to $33_n$ are each connected to an output end in a corresponding column of the signal output unit 60.

The write scanning unit 40 includes a shift register circuit or the like. This write scanning unit 40 performs so-called line sequential scanning when a signal voltage of a video signal is written in each of the pixels 20 in the pixel array unit 30. In the line sequential scanning, a write scanning signal WS ($WS_1$ to $WS_m$) is sequentially supplied to the scanning line 31 ($31_1$ to $31_m$), thereby sequentially scanning each of the pixels 20 in the pixel array unit 30 in units of rows.

Similarly to the write scanning unit 40, the power supply scanning unit 50 includes a shift register circuit or the like. This power supply scanning unit 50 supplies, in synchronization with the line sequential scanning by the write scanning unit 40, a power-supply voltage DS ($DS_1$ to $DS_m$) to the power supply line 32 ($32_1$ to $32_m$), the power-supply voltage DS ($DS_1$ to $DS_m$) being switchable between a first power-supply voltage $V_{ccp}$ and a second power-supply voltage $V_{ini}$ lower than the first power-supply voltage $V_{ccp}$. As described later, light emitting/non-light emitting (quenching) of the pixels 20 is controlled by a switchover between the $V_{ccp}$ and $V_{ini}$ of the power-supply voltage DS.

The signal output unit 60 selectively outputs a signal voltage $V_{sig}$ of the video signal according to luminance information (hereinafter, described simply as "signal voltage" in some cases) and a reference voltage $V_{ofs}$, the signal voltage $V_{sig}$ and the reference voltage $V_{ofs}$ being supplied from a signal supply source (not illustrated). Herein, the reference voltage $V_{ofs}$ is a voltage that serves as a reference of the signal voltage $V_{sig}$ of the video signal (for example, a voltage equivalent to a black level of the video signal). The reference voltage $V_{ofs}$ is used when a threshold value correction process described later is performed.

The signal voltage $V_{sig}$/reference voltage $V_{ofs}$ output from the signal output unit 60 are written in each of the pixels 20 in the pixel array unit 30, in units of pixel rows selected by scanning by the write scanning circuit 40, through the signal line 33 ($33_1$ to $33_n$). That is, the signal output unit 60 employs a drive form of line sequential writing in which the signal voltage $V_{sig}$ is written in units of rows (lines).

[Pixel Circuit]

Figure 2:
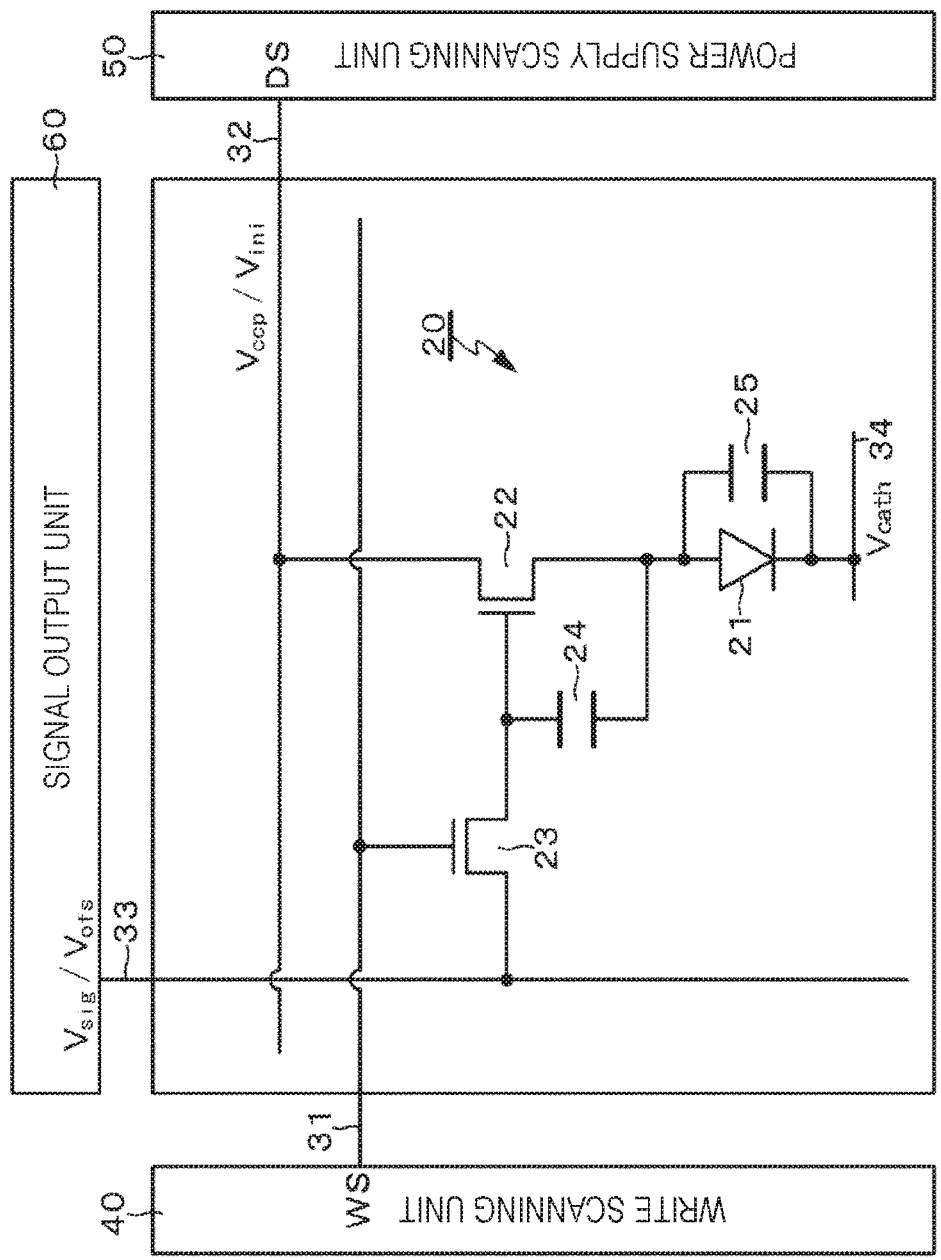
FIG. 2 is a circuit diagram illustrating a circuit configuration of a unit pixel (pixel circuit) of 2Tr2C.

FIG. 2 is a circuit diagram illustrating an exemplary specific circuit configuration of the unit pixels (pixel circuit) 20. The light-emitting unit of the pixels 20 includes an organic EL element 21 that is an example of a current drive-type electrooptic element, the light emission luminance of which varies according to a value of a current that flows through the device.

As illustrated in FIG. 2, the pixels 20 each include the organic EL element 21 and a driving circuit that drives the organic EL element 21 by passing a current through the organic EL element 21. A cathode electrode of the organic EL element 21 is connected to a common power line 34 that is wired in common to all of the pixels 20.

The driving circuit that drives the organic EL element 21 includes a driving transistor 22, a write transistor 23, a retentive capacity 24, and an auxiliary capacity 25. That is, the driving circuit has a circuit configuration of 2Tr2C that includes two transistors (Tr) and two capacitative elements (C). Herein, N-channel thin film transistors (TFT) are used as the driving transistor 22 and the write transistor 23. However, a conductivity-type combination of the driving transistor 22 and the write transistor 23 illustrated herein is merely an example, and the circuit configuration is not limited to this combination.

One electrode (source/drain electrode) of the driving transistor 22 is connected to the power supply line 32 ($32_1$ to $32_m$), and the other electrode (source/drain electrode) thereof is connected to an anode electrode of the organic EL element 21. One electrode (source/drain electrode) of the write transistor 23 is connected to the signal line 33 ($33_1$ to $33_n$), and the other electrode (source/drain electrode) thereof is connected to a gate electrode of the driving transistor 22. Furthermore, a gate electrode of the write transistor 23 is connected to the scanning line 31 ($31_1$ to $31_m$).

In the driving transistor 22 and the write transistor 23, one electrode refers to a metal wire electrically connected to one source/drain region, and the other electrode refers to a metal wire electrically connected to the other source/drain region. Furthermore, depending on an electric potential relationship between one electrode and the other electrode, one electrode serves as either a source electrode or a drain electrode and the other electrode serves as either a drain electrode or a source electrode.

One electrode of the retentive capacity 24 is connected to the gate electrode of the driving transistor 22, and the other electrode thereof is connected to the other electrode of the driving transistor 22 and the anode electrode of the organic EL element 21. One electrode of the auxiliary capacity 25 is connected to the anode electrode of the organic EL element 21, and the other electrode thereof is connected to the cathode electrode of the organic EL element 21, that is, the auxiliary capacity 25 is connected in parallel to the organic EL element 21.

In the above configuration, the write transistor 23 becomes a conduction state in response to the write scanning signal WS that becomes active in a high voltage state and is applied from the write scanning unit 40 to the gate electrode through the scanning line 31. As a result, the write transistor 23 samples the signal voltage $V_{sig}$ of the video signal according to luminance information or the reference voltage $V_{ofs}$, and then writes the signal voltage $V_{sig}$ or the reference voltage $V_{ofs}$ in the pixels 20. The signal voltage $V_{sig}$ and the reference voltage $V_{ofs}$ are supplied at different timings from the signal output unit 60 through the signal line 33. The signal voltage $V_{sig}$ or the reference voltage $V_{ofs}$ written by the write transistor 23 is retained in the retentive capacity 24.

When the power-supply voltage DS in the power supply line 32 ($32_1$ to $32_m$) is at the first power-supply voltage $V_{ccp}$, one electrode of the driving transistor 22 serves as a drain electrode and the other electrode thereof serves as a source electrode, and the driving transistor 22 operates in a saturation region. As a result, the driving transistor 22 is supplied with a current from the power supply line 32, and drives the organic EL element 21 to emit light by current drive. More specifically, the driving transistor 22 operates in the saturation region, thereby supplying, to the organic EL element 21, a driving current at a current value according to a voltage value of the signal voltage $V_{sig}$ retained at the retentive capacity 24 and driving the organic EL element 21 to emit light by current drive.

Additionally, when the power-supply voltage DS switches from the first power-supply voltage $V_{ccp}$ to the second power-supply voltage $V_{ini}$, one electrode of the driving transistor 22 serves as a source electrode and the other electrode thereof serves as a drain electrode, and the driving transistor 22 operates as a switching transistor. As a result, the driving transistor 22 stops supplying the driving current to the organic EL element 21, and puts the organic EL element 21 into a non-light-emitting state. That is, the driving transistor 22 also has a function as a transistor that controls light, emitting/non-light emitting of the organic EL element 21.

This switching operation of the driving transistor 22 allows setting of a time period (non-light-emitting period) during which the organic EL element 21 goes into a non-light-emitting state and control of a proportion (duty) of a light-emitting period to the non-light-emitting period of the organic EL element 21. This duty control allows reduction in afterimage blur that is associated with light emission of the pixels over a one-display frame period. Therefore, in particular, the image quality of a moving image can be further improved.

The first power-supply voltage $V_{ccp}$, among the first power-supply voltage and the second power-supply voltage $V_{ccp}$, $V_{ini}$ that are selectively supplied from the power supply scanning unit 50 through the power supply line 32, is a power-supply voltage to supply, to the driving transistor 22, a driving current to drive the organic EL element 21 to emit light. Furthermore, the second power-supply voltage $V_{ini}$ is a power-supply voltage to apply a reverse bias to the organic EL element 21. When a voltage lower than the reference voltage $V_{ofs}$, for example, a threshold voltage of the driving transistor 22 is $V_{th}$, this second power-supply voltage $V_{ini}$ is set to a voltage lower than $V_{ofs}-V_{th}$, and preferably is set to a voltage sufficiently lower than $V_{ofs}-V_{th}$.

Each of the pixels 20 in the pixel array unit 30 has a function to correct a variation in a driving current caused by a variation in characteristics of the driving transistor 22. Examples of the characteristics of the driving transistor 22 include the threshold voltage $V_{th}$ of the driving transistor 22 and a mobility μ of a semiconductor thin film constituting a channel of the driving transistor 22 (hereinafter, described simply as "mobility μ of the driving transistor 22").

A correction of the variation in the driving current caused by the variation in the threshold voltage $V_{th}$ (hereinafter, described as "threshold value correction") is performed by initializing a gate voltage $V_g$ of the driving transistor 22 to the reference voltage $V_{ofs}$. Specifically, there is performed an operation to change a source voltage $V_s$ of the driving transistor 22 toward an electric potential obtained by subtracting the threshold voltage $V_{th}$ of the driving transistor 22 from the initialized voltage, on the basis of the initialized voltage of the gate voltage $V_g$ of the driving transistor 22 (reference voltage $V_{ofs}$). When this operation progresses, the gate-source voltage $V_{gs}$ of the driving transistor 22 eventually converges into the threshold voltage $V_{th}$ of the driving transistor 22. A voltage equivalent to this threshold voltage $V_{th}$ is retained in the retentive capacity 24. Then, the voltage equivalent to the threshold voltage $V_{th}$ is retained in the retentive capacity 24, thus making it possible to suppress dependency of a drain-source current $I_{ds}$, which flows through the driving transistor 22, on the threshold voltage $V_{th}$ when the driving transistor 22 is driven by the signal voltage $V_{sig}$ of the video signal.

Meanwhile, a correction of the variation in a driving current caused by the variation in the mobility μ (hereinafter, described as "mobility correction") is performed by passing a current via the driving transistor 22 through the retentive capacity 24 when the write transistor 23 becomes the conduction state and is writing the signal voltage $V_{sig}$ of the video signal. In other words, the correction is performed by applying a negative feedback to the retentive capacity 24, with a feedback quantity (correction amount) according to the current $I_{ds}$ that flows through the driving transistor 22. When the video signal is written by the above threshold value correction, the dependency of the drain-source current $I_{ds}$ on the threshold voltage $V_{th}$ has been canceled, and the drain-source current $I_{ds}$ is dependent on the mobility μ of the driving transistor 22. Therefore, a negative feedback is applied to a drain-source voltage $V_{ds}$ of the driving transistor 22, with the feedback quantity according to the current $I_{ds}$ that flows through the driving transistor 22. This allows suppressing dependency of the drain-source current $I_{ds}$, which flows through the driving transistor 22, on the mobility μ.

[Resonator Structure]

In the above-described organic EL display device 10 in which the unit pixels 20 including a plurality of subpixels each having a different luminescent color are disposed in a matrix, a resonator structure that emphasizes light having a specific wavelength by a resonance effect is employed in order to expand a color gamut and improve luminance efficiency. Hereinafter, a conventional example of the resonator structure will be described with reference to FIG. 3.

Figure 3:
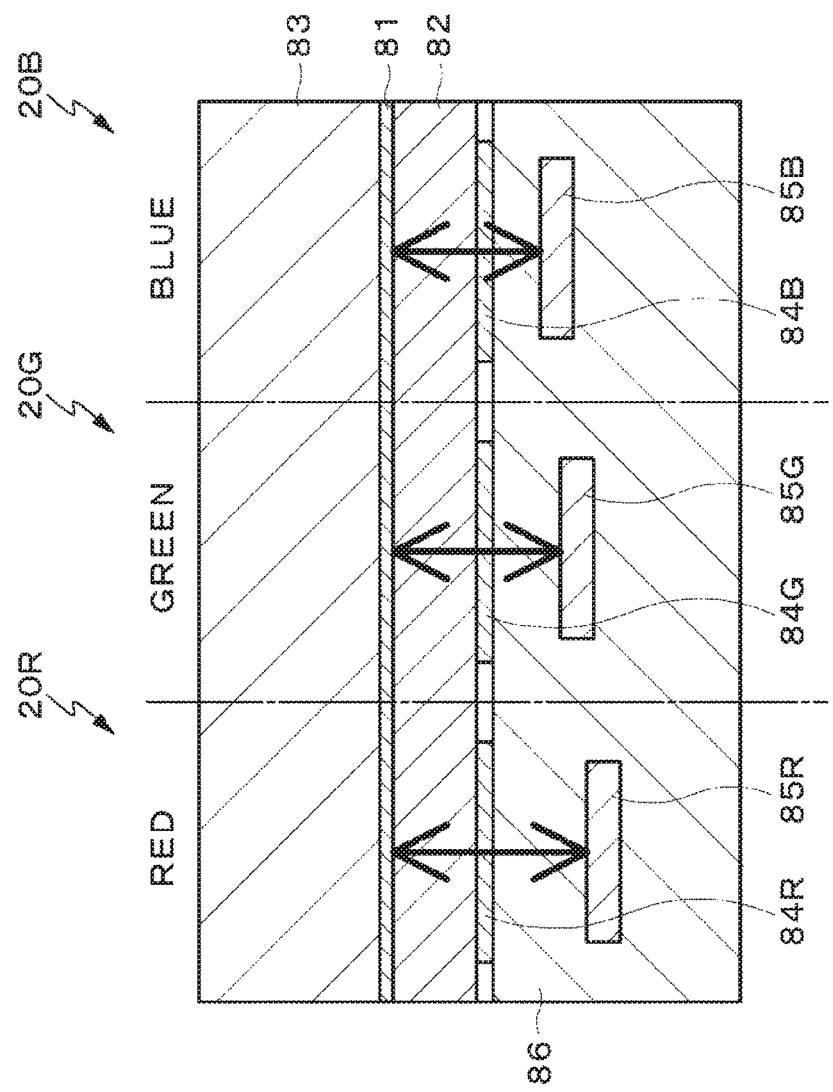
FIG. 3 is a cross-sectional view illustrating a pixel structure according to a conventional example of three RGB subpixels having a resonator structure.

FIG. 3 is a cross-sectional view illustrating a pixel structure according to a conventional example of three subpixels 20R, 20G, and 20B in R (RED), G (GREEN), and B (BLUE) having a resonator structure. In the pixel structure according to the conventional example illustrated in FIG. 3, a cathode electrode 81 is made of, for example, alloy of magnesium (Mg) and silver (Ag) (Mg—Ag alloy), configured to serve also as a semi-transmissive plate (semi-transmissive electrode), and provided in common to all pixels (subpixels). The cathode electrode 81 is formed on an organic layer 82 that is a light-emitting function layer. On the cathode electrode 81, a protective film 83 that protects the cathode electrode 81 is formed.

The organic layer 82 is a white light-emitting function layer that emits white light, and formed on anode electrodes 84R, 84G, and 84B made of, for example, indium tin oxide (ITO) that is a transparent conductive material. Light reflectors 85R, 85G, and 85B that are made of, for example, alloy of aluminum (Al) and copper (Cu) (Al—Cu alloy) are placed below the anode electrodes 84R, 84G, and 84B, for the subpixels 20R, 20G, and 20B respectively. Furthermore, an interlayer film 86 is interposed between the anode electrodes 84R, 84G, and 84B and the light reflectors 85R, 85G, and 85B.

In the pixel structure according to the conventional example configured as above, a resonator structure that resonates light generated at the organic layer 82 that is a white light-emitting function layer is formed, using the cathode electrode 81 that is the semi-transmissive electrode and the light reflectors 85R, 85G, and 85B. In this resonator structure, the film thickness of the interlayer film 86 interposed between the anode electrodes 84R, 84 G, and 84B and the light reflectors 85R, 85G, and 85 B is changed. By doing so, the optical path length between the cathode electrode 81 and the light reflectors 85R, 85G, and 85B is changed and optimized for each luminescent color, thereby changing the luminescent color for each pixel (subpixel).

To maximally utilize the resonance effect in the organic EL display device 10 including the subpixels 20R, 20G, and 20B having a resonator structure, it is necessary to suppress a variation in a final optical path length of the resonator structure.

However, in the pixel structure according to the conventional example configured as above, the interlayer film 86 is interposed between the anode electrodes 84R, 84G, and 84B and the light reflectors 85R, 85G, and 85B, and the film thickness of the interlayer film 86 is changed. By doing so, the optical path length between the cathode electrode 81 and the light reflectors 85R, 85G, and 85B is optimized. Therefore, the final optical path length is determined only by the film formation of the organic layer 82 that is a light-emitting function layer and cannot be processed. This makes it difficult to adjust the final optical path length even if there is a variation in the final optical path length. As a result, it is impossible to maximally utilize the resonance effect, thus producing a variation in a color gamut and luminance efficiency.

<One Embodiment of Present Disclosure>

Accordingly, in one embodiment of the present disclosure, to maximally utilize a resonance effect and to further enhance the resonance effect, in a pixel structure in which a light reflector and a semi-transmissive plate are disposed at a distance that differs for each luminescent color and constitute a resonator structure, a function of a cathode electrode and a function of semi-transmissive plate are separated. In addition, a configuration is employed in which an organic layer that is a light-emitting function layer, a transparent cathode electrode, and a protective film that protects the cathode electrode are laminated in order between the light reflector and the semi-transmissive plate, and the semi-transmissive plate is formed on the protective film.

As described above, in the pixel structure according to the present embodiment, the cathode electrode is disposed on the light-emitting function layer, the semi-transmissive plate is disposed on the cathode electrode through the protective film, and a resonance effect is obtained between the light reflector and the semi-transmissive plate, the distance between which differs for each luminescent color. According to this resonator structure, the semi-transmissive plate is formed after the protective film is formed and a final optical path length between the semi-transmissive plate and the light reflector can be determined by processing the protective film. Therefore, the variation in the final optical path length of the resonator structure can be suppressed. As a result, it is possible to maximally utilize a resonance effect and to further enhance the resonance effect.

The organic layer that is a light-emitting function layer includes a light-emitting layer (for example, light-emitting layer made of an organic light-emitting material). Specifically, this organic layer can include, for example, a laminated structure including a hole transport layer, a light-emitting layer, and an electron transport layer, a laminated structure including a hole transport layer and a light-emitting layer that is used also as an electron transport layer, or a laminated structure including a hole injection layer, a hole transport layer, a light-emitting layer, an electron transport layer, and an electron injection layer.

Furthermore, in a case where those laminated structures or the like are in tandem units, the organic layer may include a two-tiered tandem structure in which a first tandem unit, a connection layer, and a second tandem unit are laminated, and furthermore may include a three or more-tiered tandem structure in which three or more tandem units are laminated. In those cases, it is possible to obtain an organic layer that generally emits white light (white light-emitting function layer) by changing a luminescent color, that is, red, green, and blue, for each tandem unit, and the organic layer that generally emits white light serves as a white organic EL element in a tandem structure.

Figure 4:
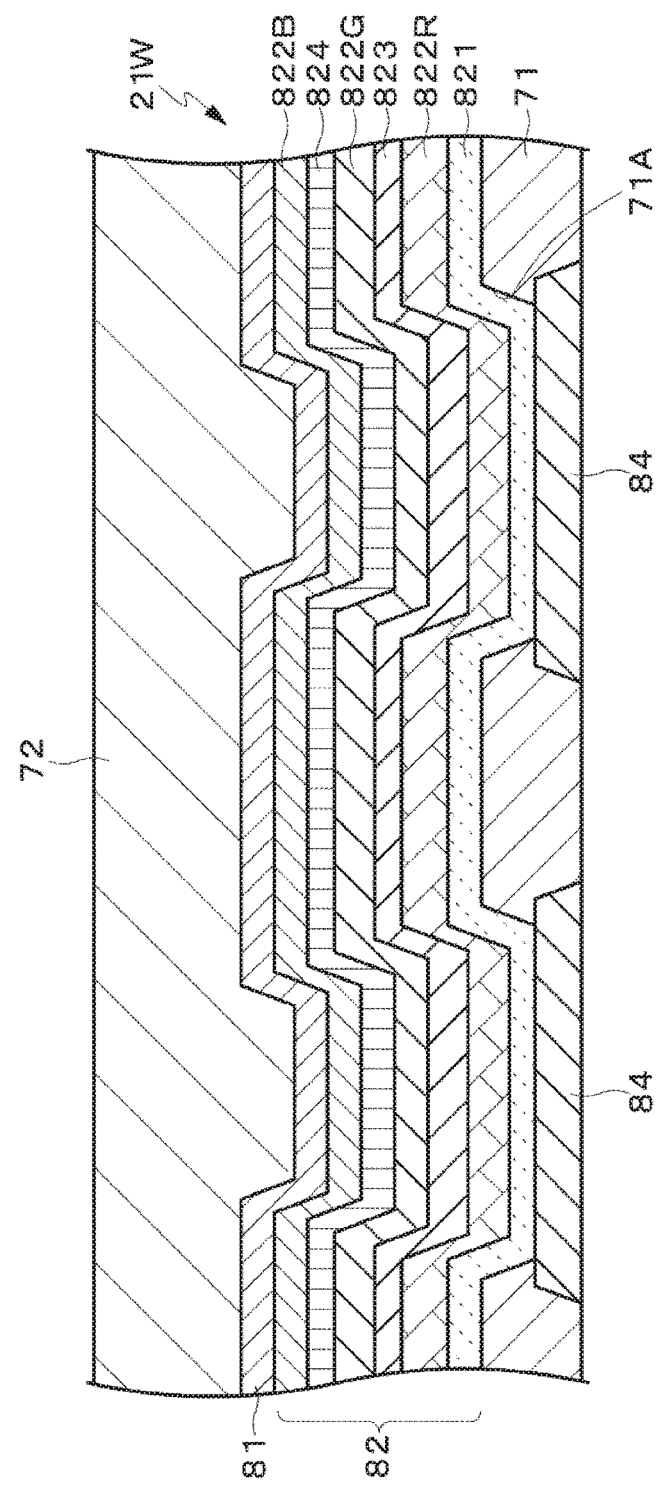
FIG. 4 is a cross-sectional view of a main part illustrating an exemplary configuration of a white organic EL element having a typical tandem structure.

FIG. 4 is a cross-sectional view of a main part illustrating an exemplary configuration of a white organic EL element having a typical tandem structure. In this view, as for a white organic EL element in a tandem structure without the resonator structure, a case of a three-tiered tandem structure is exemplified as an example, and a simplified basic structure is illustrated to simplify the drawing. Furthermore, a pixel structure of two subpixels among three RGB subpixels is illustrated.

In FIG. 4, the anode electrode 84 (84R, 84G, and 84B) is provided in units of pixels (subpixels) at the bottom of a depressed portion 71A of a wind insulation film 71. The organic layer 82 is provided in common to all pixels between this anode electrode 84 and the cathode electrode 81 that is provided in common to all pixels, and constitutes a white organic EL element 21W. In addition, an interlayer insulation film 72 is laminated on the cathode electrode 81.

In the white organic EL element 21W, the organic layer 82 is formed on the anode electrode 84, for example, by depositing a charge injection layer 821, an R light-emitting layer 822R, a connection layer 823, a G light-emitting layer 822G, a connection layer 824, and a B light-emitting layer 822B in order in common to all pixels. In addition, a current flows through the organic layer 82, from the driving transistor 22 through the anode electrode 84, under current drive by the driving transistor 22 in FIG. 2. This allows light to be emitted when an electron and a hole recombine in each of the light-emitting layers 822R, 822G, and 822B in the organic layer 82. At this time, luminescent colors of the R, G, and B light-emitting layers 822R, 822G, and 822B are superimposed on (combined with) one another to turn into white light.

Hereinafter, description will be given on a specific embodiment of the pixel structure according to the present embodiment including the resonator structure.

[First Embodiment]

Figure 5:
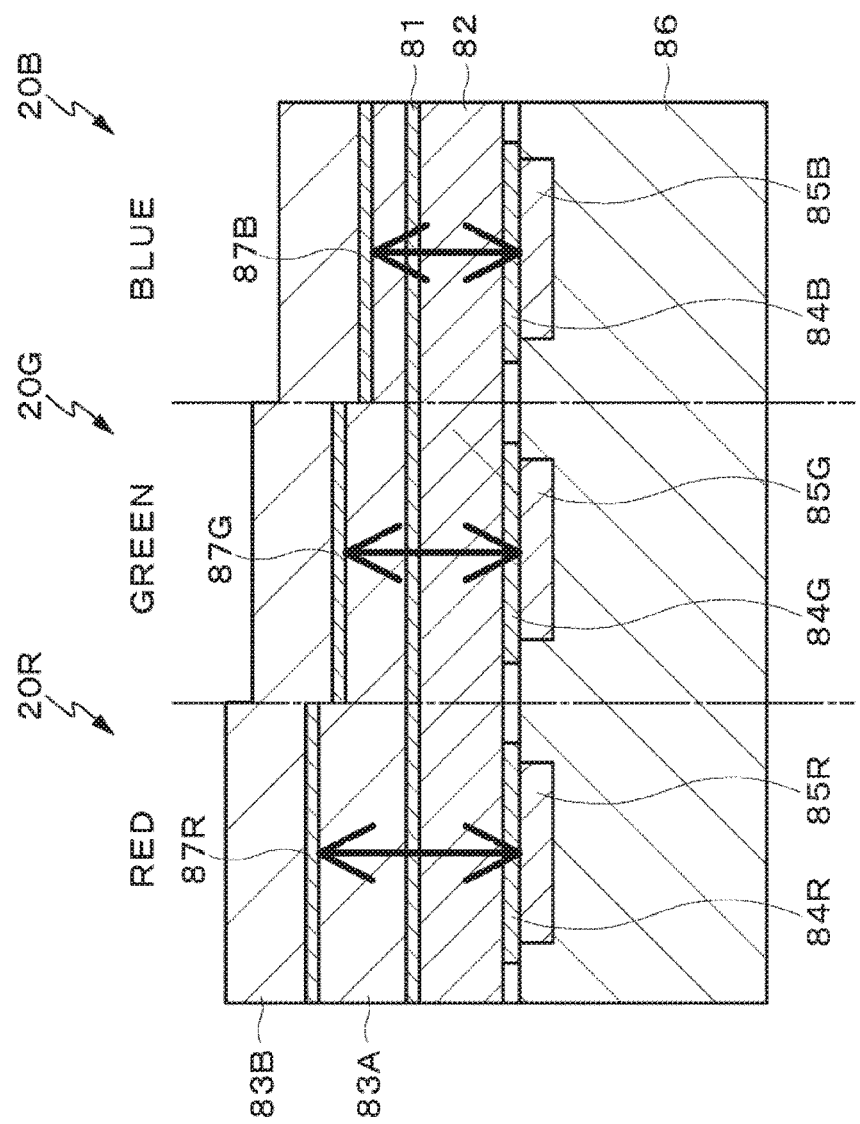
FIG. 5 is a cross-sectional view illustrating a pixel structure according to a first embodiment of the three RGB subpixels having the resonator structure.

FIG. 5 is a cross-sectional view illustrating a pixel structure according to a first embodiment of the three RGB subpixels having a resonator structure having a resonator structure.

In FIG. 5, each of the light reflectors 85R, 85G, and 85B in RGB subpixels 20R, 20G, and 20B is made of, for example, Al—Cu alloy and formed, as an identical layer among each luminescent color, on a surface part of an interlayer film 86. In each of the RGB subpixels 20R, 20G, and 20B, transparent anode electrodes 84R, 84G, and 84B that are made of, for example, ITO are formed on the light reflectors 85R, 85G, and 85B.

An organic layer 82 that is a white light-emitting function layer is formed on the anode electrodes 84R, 84G, and 84 B. A transparent cathode electrode 81 made of, for example, ITO is formed on this organic layer 82, in common to all pixels. In addition, on the cathode electrode 81, a protective film 83A that protects the cathode electrode 81 is formed of a silicon nitride film SiN or the like. The protective film 83A has a different thickness for each of the subpixels 20R, 20G, and 20B. This thickness difference can be formed by a dry etching process or the like.

On the protective film 83A that has a different thickness for each of the subpixels 20R, 20G, and 20B, semi-transmissive plates 87R, 87G, and 87B are formed from, for example, Mg—Ag alloy and alumina ($Al_2O_3$), as half mirrors. On the semi-transmissive plates 87R, 87G, and 87B, a protective film 83B that protects these semi-transmissive plates 87R, 87G, and 87B is formed of a silicon nitride film SiN or the like.

In the pixel structure according to the first embodiment configured as above, a resonator structure that resonates light generated at the organic layer 82 that is a white light-emitting function layer is formed, using the semi-transmissive plates 87R, 87G, and 87B that have a function separate from the function of the cathode electrode 81, and the light reflectors 85R, 85G, and 85B. In this resonator structure, the film thickness of the protective film 83A interposed between the cathode electrode 81 and the semi-transmissive plates 87R, 87G, and 87B is changed. By doing so, the optical path length between the semi-transmissive plates 87R, 87G, and 87B and the light reflectors 85R, 85G, and 85B is changed and optimized for each luminescent color, thereby changing the luminescent color for each pixel (subpixel).

According to the resonator structure in the pixel structure according to the first embodiment, the protective film 83A is formed, and a step is formed for each luminescent color by the dry etching process or the like. After the formation of the step, the semi-transmissive plates 87R, 87G, and 87B are formed. This allows determining the final optical path length between the semi-transmissive plates 87R, 87G, and 87B and the light reflectors 85R, 85G, and 85B by processing the protective film 83A. Therefore, it is possible to suppress a variation in the final optical path length of the resonator structure. As a result, it is possible to maximally utilize a resonance effect and to further enhance the resonance effect. As a result, a variation in a color gamut and luminance efficiency can be suppressed.

In the pixel structure according to the conventional example described earlier (refer to FIG. 3), the interlayer film 86 is interposed between the anode electrodes 84R, 84G, and 84B and the light reflectors 85R, 85G, and 85B, and the film thickness of the interlayer film 86 is changed. By doing so, the optical path length between the cathode electrode 81 and the light reflectors 85R, 85G, and 85B is optimized. Therefore, transparent electrodes that are the anode electrodes 84R, 84G, and 84B are necessary, separately from the light reflectors 85R, 85G, and 85B.

In a case of the pixel structure according to the first embodiment, in the above example, the anode electrodes 84R, 84G, and 84B that are transparent electrodes are provided, separately from the light reflectors 85R, 85G, and 85B. However, a configuration can be employed in which the light reflectors 85R, 85G, and 85B have functions of the anode electrodes 84R, 84G, and 84B. That is, the light reflectors 85R, 85G, and 85B can be used also as the anode electrodes 84R, 84G, and 84B.

[Second Embodiment]

Figure 6:
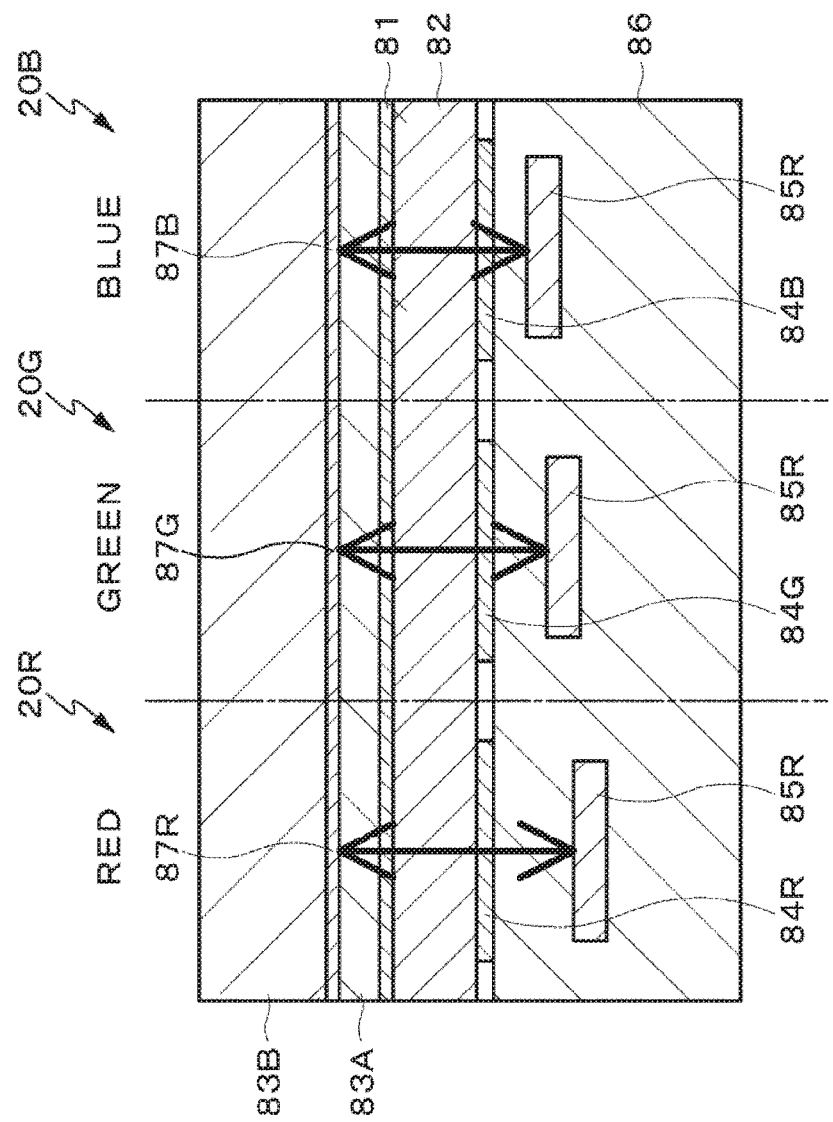
FIG. 6 is a cross-sectional view illustrating a pixel structure according to a second embodiment of the three RGB subpixels having the resonator structure.

FIG. 6 is a cross-sectional view illustrating a pixel structure according to a second embodiment of the three RGB subpixels having a resonator structure having a resonator structure.

As illustrated in FIG. 6, anode electrodes 84R, 84G, and 84B each include a transparent electrode and are provided between an interlayer film 86 and an organic layer 82 that is a white light-emitting function layer. In addition, in the pixel structure according to the second embodiment, the film thickness of the interlayer film 86 interposed between the anode electrodes 84R, 84G, and 84B and light reflectors 85R, 85G, and 85B is changed, thereby changing a luminescent color for each pixel (subpixel). This is similar to the pixel structure according to the conventional example described earlier (refer to FIG. 3). However, there is a great configurational difference from the pixel structure according to the conventional example in that semi-transmissive plates 87R, 87G, and 87B are provided separately from a cathode electrode 81, a protective film 83A is formed on the cathode electrode 81, and the cathode electrode 81 is formed on the protective film 83A.

Also in the pixel structure according to the second embodiment configured as above, as with the pixel structure according to the first embodiment, a resonator structure that resonates light generated at the organic layer 82 that is a white light-emitting function layer is formed, using the semi-transmissive plates 87R, 87G, and 87B that have a function separate from the function of the cathode electrode 81, and the light reflectors 85R, 85G, and 85B. However, unlike the pixel structure according to the first embodiment, the film thickness of the interlayer film 86 interposed between the anode electrodes 84R, 84G, and 84B and the light reflectors 85R, 85G, and 85B is changed. By doing so, the optical path length between the semi-transmissive plates 87R, 87G, and 87B and the light reflectors 85R, 85G, and 85B is changed and optimized for each luminescent color, thereby changing the luminescent color for each pixel (subpixel).

According to the resonator structure in the pixel structure according to the second embodiment, the semi-transmissive plates 87R, 87G, and 87B are formed after the protective film 83A is formed. This allows determining the final optical path length between the semi-transmissive plates 87R, 87G, and 87B and the light reflectors 85R, 85G, and 85B by processing the protective film 83A. Therefore, it is possible to suppress a variation in the final optical path length of the resonator structure. As a result, it is possible to maximally utilize a resonance effect and to further enhance the resonance effect. As a result, a variation in a color gamut and luminance efficiency can be suppressed.

[Electronic Apparatus]

The above-described display device according to the present disclosure can be used as a display unit (display device) for electronic apparatuses in all fields that display a video signal input in the electronic apparatus or a video signal produced in the electronic apparatus as an image or video. As an example, the display device can be used as a display unit for, for example, a television set, a digital still camera, a notebook type personal computer, a handheld terminal device such as a mobile phone, a video camera, and a head mounted display.

As described above, the display device according to the present disclosure is used as a display unit, in electronic apparatuses in all fields, whereby the following effects can be obtained. That is, according to the technology of the present disclosure, it is possible to maximally utilize the resonance effect and to further enhance the resonance effect. As a result, a variation in a color gamut and luminance efficiency can be suppressed. This can contribute to improvement in display quality.

The display device according to the present disclosure includes those in a module form having a sealed structure. As an example, a display module formed by attaching an opposing portion of transparent glass or the like to a pixel array unit corresponds to the display device in the module form. Note that a circuit unit to input/output, a signal or the like from the outside to the pixel array unit, a flexible printed circuit (FPC) or the like may be provided in the display module. Hereinafter, a digital still camera and a head mounted display will be exemplified as specific examples of an electronic apparatus that uses the display device according to the present disclosure. However, specific examples exemplified herein are merely examples, and examples are not limited to those specific examples.

SPECIFIC EXAMPLE 1

Figure 7A:
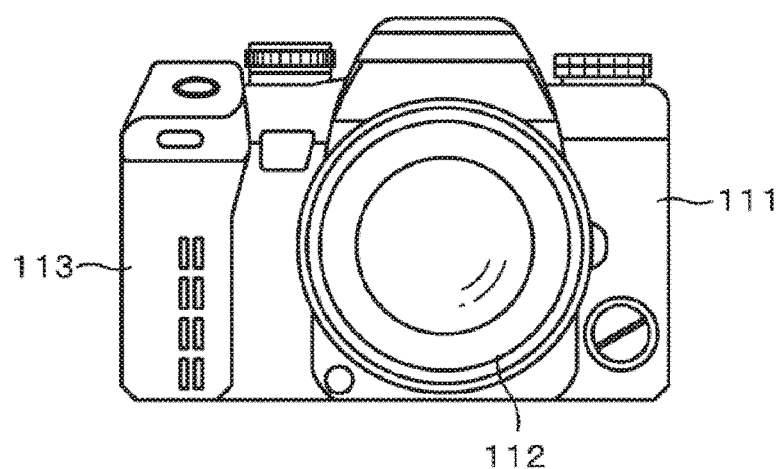
FIG. 7A is a front view thereof and FIG. 7B is a back view thereof.
Figure 7B:
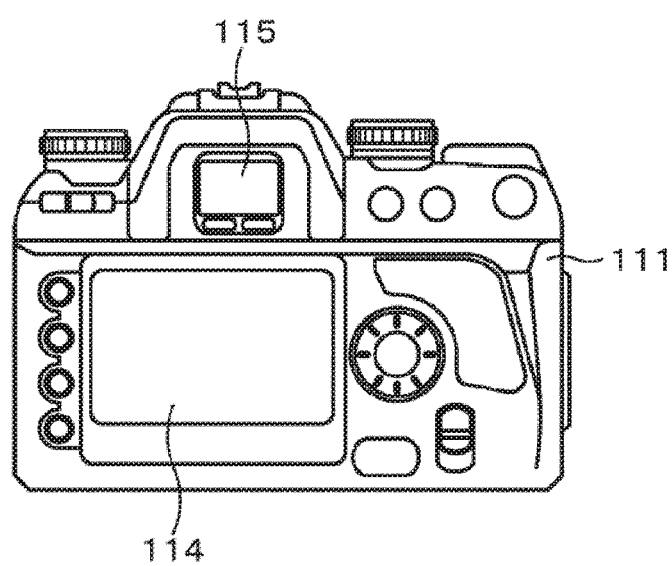

FIG. 7 is an external view illustrating a lens-interchangeable single-lens reflex type digital still camera; FIG. 7A is a front view thereof and FIG. 7B is a back view thereof. A lens-interchangeable single-lens reflex type digital still camera includes, for example, an interchangeable photographic lens unit (replacement lens) 112 on the front right side of a camera body unit (camera body) 111, and a grip unit 113, which is to be griped by a photographer, on the front left side.

In addition, a monitor 114 is provided substantially at the center of the back face of the camera body unit 111. A view finder (eyepiece window) 115 is provided above the monitor 114. The photographer can look into the view finder 115, thereby being able to visually check a light image of an object derived from the photographic lens unit 112 and determining a composition, In the lens-interchangeable single-lens reflex type digital still camera configured as above, the display device according to the present disclosure can be used as the view finder 115. That is, the lens-interchangeable single-lens reflex type digital still camera according to the present example is manufactured using the display device according to the present disclosure as the view finder 115.

SPECIFIC EXAMPLE 2

Figure 8:
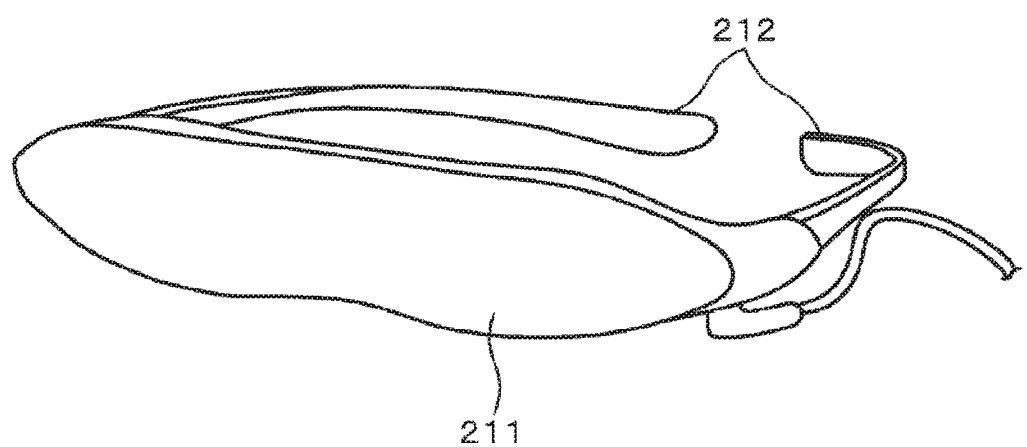
FIG. 8 is an external view of a head mounted display.

FIG. 8 is an external view of a head mounted display. The head mounted display includes, for example, an ear hook portion 212 on each side of a display unit 211 of a glass shape. The ear hook portion 212 is to be attached to a user's head. In this head mounted display, the display device according to the present disclosure can be used as the display unit 211. That is, the head mounted display according to the present example is manufactured using the display device according to the present disclosure as the display unit 211.

Note that the present disclosure can employ the following configuration.

[1] A display device including:

a light reflector;

a semi-transmissive plate, the light reflector and the semi-transmissive plate being disposed at a distance that differs for each luminescent color;

a light-emitting function layer including a light-emitting layer;

a transparent cathode electrode; and a protective film that protects the cathode electrode, in which the light-emitting function layer, the cathode electrode, and the protective film are laminated in order between the light reflector and the semi-transmissive plate, and the semi-transmissive plate is formed on the protective film.

[2] The display device described in above [1], in which a film thickness of the protective film differs for each luminescent color.

[3] The display device described in above [1] or [2], further including a transparent anode electrode between the light reflector and the light-emitting function layer.

[4] The display device described in above [1] or [2], in which the light reflector has a function of an anode electrode.

[5] The display device described in above [1], further including an interlayer film between the light reflector and the light-emitting function layer, the interlayer film having a film thickness that differs for each luminescent color.

[6] The display device described in above [5], further including a transparent anode electrode between the interlayer film and the light-emitting function layer.

[7] The display device described in any of above [1] to [6], in which the light-emit ting function layer emits white light.

[8] The display device described in above [7], in which the light-emitting function layer is formed by laminating a red light-emitting function layer that emits red light, a green light-emitting function layer that emits green light, and a blue light-emitting function layer that emits blue light.

[9] An electronic apparatus including a display device, in which the display device includes:

a light reflector;

a semi-transmissive plate, the light reflector and the semi-transmissive plate being disposed at a distance that differs for each luminescent color;

a light-emitting function layer including a light-emitting layer;

a transparent cathode electrode; and a protective film that protects the cathode electrode, the light-emitting function layer, the cathode electrode, and the protective film are laminated in order between the light reflector and the semi-transmissive plate, and the semi-transmissive plate is formed on the protective film.

REFERENCE SIGNS LIST

10 Organic EL display device
20 (20R, 20G, 20B) Unit pixel (pixel/pixel circuit)
21 (21R, 21G, 21B, 21W) Organic EL element
22 Driving transistor
23 Write transistor
24 Retentive capacity
25 Auxiliary capacity
30 Pixel array unit
31 ($31_1$ to $31_m$) Scanning line
32 ($32_1$ to $32_m$) Power supply line
33 ($33_1$ to $33_n$) Signal line
34 Common power line
40 Write scanning unit
50 Power supply scanning unit
60 Signal output unit
70 Display panel
81 Cathode electrode
82 Organic layer (white light-emitting function layer)
83, 83A, 83B Protective film
84R, 84G, 84B Anode electrode
85R, 85G, 85B Light reflector
86 Interlayer film
87R, 87G, 87B Semi-transmissive plate

The invention claimed is:

1. A display device comprising:

a pixel array area including a plurality of pixels, at least one of the pixels comprising:

a red subpixel, a green subpixel and a blue subpixel, a first light reflector for the red subpixel, a second light reflector for the green subpixel and a third light reflector for the blue subpixel arranged along a first direction;

a semi-transmissive plate including an upper surface and a lower surface, the upper surface and the lower surface extending in the first direction in parallel, the lower surface being closer to the first light reflector, the second light reflector and the third light reflector, and the lower surface extending contiguously along a single straight line in the first direction over the first, second and third light reflectors;

a light-emitting function layer including light-emitting layer portions respectively corresponding to the red subpixel, the green subpixel and the blue subpixel;

a transparent cathode electrode extending along the first direction; and a protective film over the cathode electrode, wherein the light-emitting function layer, the cathode electrode, and the protective film are arranged along a second direction perpendicular to the first direction, between the light reflectors and the semi-transmissive plate, at least an upper surface of the protective film extending contiguously in parallel to the single straight line and the lower surface of the semi-transmissive plate over the first, second and third light reflectors, the first light reflector, the second light reflector and the third light reflector are respectively arranged at three different distances from the lower surface of the semi-transmissive plate along the second direction, and the semi-transmissive plate is formed on the protective film.

2. The display device according to claim 1, further comprising a transparent anode electrode between at least one of the light reflectors and the light-emitting function layer.

3. The display device according to claim 1, further comprising an interlayer film between the light reflectors and the light-emitting function layer, the interlayer film having a film thickness that differs for each of the light reflectors.

4. The display device according to claim 3, further comprising a transparent anode electrode between the interlayer film and the light-emitting function layer.

5. The display device according to claim 1, wherein the light-emitting function layer emits white light.

6. An electronic apparatus comprising a display device, wherein the display device includes:

a pixel array area including a plurality of pixels, at least one of the pixels comprising:

a red subpixel, a green subpixel and a blue subpixel, a first light reflector for the red subpixel, a second light reflector for the green subpixel and a third light reflector for the blue subpixel arranged along a first direction;

a semi-transmissive plate including an upper surface and a lower surface, the upper surface and the lower surface extending in the first direction in parallel, the lower surface being closer to the first light reflector, the second light reflector and the third light reflector, and the lower surface extending contiguously along a single straight line in the first direction over the first, second and third light reflectors;

a light-emitting function layer including light-emitting layer portions respectively corresponding to the red subpixel, the green subpixel and the blue subpixel;

a transparent cathode electrode extending along the first direction; and a protective film over the cathode electrode, wherein the light-emitting function layer, the cathode electrode, and the protective film are arranged along a second direction perpendicular to the first direction, between the light reflectors and the semi-transmissive plate, at least an upper surface of the protective film extending contiguously in parallel to the single straight line and the lower surface of the semi-transmissive plate over the first, second and third light reflectors, the first light reflector, the second light reflector and the third light reflector are respectively arranged at three different distances from the lower surface of the semi-transmissive plate along the second direction, and the semi-transmissive plate is formed on the protective film.

7. The electronic apparatus according to claim 6, further comprising a transparent anode electrode between at least one of the light reflectors and the light-emitting function layer.

8. The electronic apparatus according to claim 6, further comprising an interlayer film between the light reflectors and the light-emitting function layer, the interlayer film having a film thickness that differs for each of the light reflectors.

9. The electronic apparatus according to claim 8, further comprising a transparent anode electrode between the interlayer film and the light-emitting function layer.

10. The electronic apparatus according to claim 6, wherein the light-emitting function layer emits white light.

* * * * *